United States Patent
Meyer et al.

(10) Patent No.: US 9,638,830 B2
(45) Date of Patent: May 2, 2017

(54) OPTIMIZING DRILLING OPERATIONS USING PETROTECHNICAL DATA

(75) Inventors: Joerg H. Meyer, Houston, TX (US);
Annabelle Kania, Houston, TX (US);
Mark Egan, Sugar Land, TX (US);
Andrew Hawthorn, Missouri City, TX (US)

(73) Assignee: WESTERNGECO L.L.C., Houston, TX (US)

( * ) Notice: Subject to any disclaimer, the term of this patent is extended or adjusted under 35 U.S.C. 154(b) by 1485 days.

(21) Appl. No.: 11/957,274

(22) Filed: Dec. 14, 2007

(65) Prior Publication Data

US 2009/0157367 A1    Jun. 18, 2009

(51) Int. Cl.
| G06G 7/48 | (2006.01) |
| G01V 99/00 | (2009.01) |
| E21B 7/04 | (2006.01) |
| E21B 44/00 | (2006.01) |
| G06F 17/50 | (2006.01) |

(52) U.S. Cl.
CPC .............. G01V 99/005 (2013.01); E21B 7/04 (2013.01); E21B 44/00 (2013.01); G06F 17/5009 (2013.01)

(58) Field of Classification Search
CPC .................................................. G01V 99/005
USPC ......................................................... 703/10
See application file for complete search history.

(56) References Cited

U.S. PATENT DOCUMENTS

| 5,012,453 A | 4/1991 | Katz |
| 5,513,150 A | 4/1996 | Sicking et al. |
| 5,895,437 A | 4/1999 | Di Cesare et al. |
| 5,995,446 A * | 11/1999 | Meyer et al. .................... 367/25 |
| 6,344,746 B1 * | 2/2002 | Chunduru et al. ............ 324/339 |
| 6,424,918 B1 | 7/2002 | Jorgensen et al. |
| 6,430,507 B1 | 8/2002 | Jorgensen et al. |
| 6,502,037 B1 | 12/2002 | Jorgensen et al. |
| 6,549,854 B1 | 4/2003 | Malinverno et al. |
| 6,675,097 B2 | 1/2004 | Routh et al. |
| 6,766,254 B1 | 7/2004 | Bradford et al. |
| 6,826,486 B1 | 11/2004 | Malinverno |
| 7,054,750 B2 | 5/2006 | Rodney et al. |
| 2005/0041526 A1 | 2/2005 | Esmersoy et al. |
| 2005/0171698 A1* | 8/2005 | Sung et al. ....................... 702/9 |

(Continued)

FOREIGN PATENT DOCUMENTS

| EP | 0367495 B1 | 5/1994 |
| GB | 2354852 | 4/2001 |

(Continued)

OTHER PUBLICATIONS

Greg Ball, "Estimation of anisotropy and anisotropic 3-D prestack depth migration, offshore Zaire", 1995, Geophysics, vol. 60, No. 5, pp. 1495-1513.*

(Continued)

*Primary Examiner* — Hugh Jones

(57) ABSTRACT

A method for optimizing drilling operations. The method includes providing an earth model of a volume having a well, obtaining petrotechnical data about the volume while drilling the well, comparing the petrotechnical data with the earth model, updating the earth model with the petrotechnical data based on the comparison, and modifying a drilling plan of the well using the updated earth model.

39 Claims, 6 Drawing Sheets

(56) References Cited

U.S. PATENT DOCUMENTS

| | | |
|---|---|---|
| 2005/0279532 A1 | 12/2005 | Ballantyne et al. |
| 2006/0090934 A1 | 5/2006 | Williams |
| 2007/0284147 A1 | 12/2007 | Moran |
| 2010/0315901 A1 | 12/2010 | Coman et al. |
| 2010/0322030 A1 | 12/2010 | Coman et al. |

FOREIGN PATENT DOCUMENTS

| | | | |
|---|---|---|---|
| GB | 2376769 A | | 12/2002 |
| GB | 2398900 A | * | 1/2004 |
| GB | 2398900 A | | 9/2004 |
| WO | 2005071222 A1 | | 8/2005 |
| WO | 2007100703 A2 | | 9/2007 |
| WO | 2010 144244 A2 | | 12/2010 |
| WO | 2010 144244 A3 | | 2/2011 |

OTHER PUBLICATIONS

Plumb et al. "Managing Drilling Risk", Oilfield Review, Summer 1999, 18 pgaes.*
Plumb et al. "The Mechanical Earth Model Concept and Its Application to High-Risk Well", IADC/SPE 59128, Feb. 23-25, 2000, 13 pages.*
Schlumberger, "RMI Borehold geology, geomechanics and 3D reservoir modeling", Apr. 2002, 12 pages.*
Dutta et al. "Estimation of formation fluid pressure using high-resolution velocity from inversion of seismic data and a rock physics model based on compaction and burial diagenesis of shales", Dec. 2006, The Leading Edge, pp. 1528-1539.*
Colombo et al. "Geophysical modeling via simultaneous joint inversion of seismic, gravity, and electromagnetic data: Application to prestack depth imaging", Mar. 2007, The Leading Edge, pp. 326-331.*
Tollefsen et al. "Optimizine Drilling and REduce Casing STrings Using REmote Real-Time Well Hydraulic Monitoring", 2006, SPE 103936, 13 pages.*
Official Journal of the European Patent Office, vol. 30, No. 11, Nov. 1, 2007, p. 592-593.
Examination Report received in the related GB Application 1011523.6, mailed on Jan. 23, 2012 (6 pages).
Examination Report received in the related GB Application 1011523.6, mailed on Jul. 5, 2012 (3 pages).
Examination report received in the related GC Application GCC/P/2008/12346, mailed on Sep. 17, 2014 (5 pages).
Office action received in the related Indonesian Application W-002010 01979, mailed on Apr. 3, 2013 (1 page).
Office action received in the related Indonesian Application W-002010 01979, mailed on Nov. 28, 2014 (1 page).
PCT Search Report, dated Apr. 16, 2009, for Application No. PCT/US2008/084441, 16 pp.
Combined Search and Examination Report of British Patent Application Serial No. GB 1207680.8 dated Jun. 21, 2012: pp. 1-8.
Chiu et al., Tomographic Determination of Three Dimensional Seismic Velocity Structure, Geophysics, Aug. 1987, p. 1085-1098, vol. 52 No. 8.
Baygun et al, Case Study—Anisotropy for Steering Horizontal Wells, Oilfield Review, 1994, p. 50-51, vol. 6 No. 4, USA.
Last et al, Integrated Approach to Managing Wellbore Instability in the Cusiana Field, Oct. 1995 SPE Annual Technical Conference and Exhibition, p. 147-160, Dallas, TX, USA.
Bryant et al., Reservoir Description for Optimal Placement of Horizontal Wells, European 3-D Reservoir Modeling Conference, Apr. 1996, Stavanger, NO, pp. 301-305.
Bertelli et al., Improving the Subsurface Geological Model while Drilling, First Break, EAGE, Jun. 1999, p. 223-228.
Migration While Drilling Continuously and Dream Software, DREAM, AGIP 1999, 4 pp.

* cited by examiner

OPTIMIZING DRILLING OPERATIONS USING PETROTECHNICAL DATA

BACKGROUND

Field of the Invention

Implementations of various technologies described herein generally relate to drilling operations.

Description of the Related Art

The following descriptions and examples do not constitute an admission as prior art by virtue of their inclusion within this section.

There is a growing demand for better and more reliable three dimensional (3D) and four dimensional (4D) reservoir images and property analysis. This may be largely due to increasing complexity, operational cost and risk associated with oil and natural gas reservoirs exploration and production. As with medical applications, images with reduced uncertainties and higher quality may be created during drilling.

SUMMARY

Various techniques described herein are directed to a method for optimizing drilling operations. The method includes providing an earth model of a volume having a well, obtaining petrotechnical data about the volume while drilling the well, comparing the petrotechnical data with the earth model, updating the earth model with the petrotechnical data based on the comparison, and modifying a drilling plan of the well using the updated earth model.

In one implementation, the earth model may be updated by performing a migration imaging process on the volume. In another implementation, the earth model may be updated by creating a three dimensional (3D) anisotropic depth model with the petrotechnical data, merging the 3D anisotropic depth model in depth sections, performing a prestack depth migration, performing tomographic anisotropic properties update, performing interpretation, performing inversion for pore pressure or lithology properties of the earth model, or combinations thereof.

In yet another implementation, the drilling plan may be modified by comparing a subsurface image, property volume or interpretation, or combinations thereof, derived from the earth model with a subsurface image, property volume or interpretation, or combinations thereof, derived from the updated earth model; and generating a set of three dimensional (3D) or two dimensional (2D) coordinates for a well trajectory based on the comparison.

In still another implementation, the drilling plan may be modified by providing a design of a well trajectory, performing an economic and technical analysis of the well trajectory, changing an existing casing plan, defining a well construction based on the well trajectory, defining a well construction based on interpretations or properties derived from the updated earth model, or combinations thereof.

In one implementation, providing the earth model may include: conducting an audit and feasibility study on the volume; and selecting the earth model based on the audit and feasibility study. Conducting the audit and feasibility study on the volume may include assessing the quality and relevance of available petrotechnical information regarding the volume. The available petrotechnical information regarding the volume may include reports or documentations pertaining to the subsurface structure and properties at or around the volume. Selecting the earth model based on the audit and feasibility study may include selecting the earth model that is most congruent with the available petrotechnical information regarding the volume. Conducting the audit and feasibility study on the volume may include performing forward modeling on earth models and seismic images of the volume. The forward modeling may include ray tracing, wavefield modeling or finite difference techniques or combinations thereof.

In yet another implementation, the method may further include highgrading the earth model prior to drilling the well. Highgrading the earth model may include enhancing the resolution of the earth model. Enhancing the resolution of the selected earth model may include increasing the vertical and spatial sampling rate. Alternatively, highgrading the earth model may include enhancing the calibration of the earth model and enhancing the calibration of the earth model may include calibrating the earth model to depth.

In still another implementation, the petrotechnical data may include wellbore measurements, gravity acquisition data, borehole seismic data, electromagnetic survey data, surface seismic data or combinations thereof.

In yet still another implementation, the earth model is updated only if the variance between the petrotechnical data and the earth model exceeds a predetermined value.

In one implementation, the method for optimizing drilling operations of a well may include highgrading an earth model of a volume having the well, obtaining petrotechnical data about the volume while drilling the well, comparing the petrotechnical data with the highgraded earth model, updating the highgraded earth model with the petrotechnical data based on the comparison, and modifying a drilling plan of the well using the updated highgraded earth model.

Various techniques described herein are also directed to a method for conducting an audit and feasibility study for drilling operations. The method may include evaluating the quality and relevance of available petrotechnical information regarding a volume having a well to be drilled, performing a forward modeling on earth models and seismic images of the volume and generating a scenario plan for the well.

Various techniques described herein are also directed to a method for providing a set of actions for modifying a drilling plan of a well. The method may include comparing a subsurface image, property volume or interpretation of an earth model of the well with a subsurface image, property volume or interpretation of an updated earth model; generating a set of three dimensional (3D) coordinates for a well trajectory based on the comparison; and modifying the drilling plan based on the well trajectory.

Various techniques described herein are also directed to a method for updating an earth model of a volume having a well. The method may include creating a three dimensional anisotropic depth model; comparing the three dimensional anisotropic depth model with petrotechnical data obtained while drilling the well; determining whether the three dimensional anisotropic depth model deviates from the petrotechnical data by greater than a predetermined amount; and if the deviation exceeds the predetermined amount, then updating the three dimensional anisotropic depth model.

The above referenced summary section is provided to introduce a selection of concepts in a simplified form that are further described below in the detailed description section. The summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

DETAILED DESCRIPTION

The discussion below is directed to certain specific implementations. It is to be understood that the discussion below is only for the purpose of enabling a person with ordinary skill in the art to make and use any subject matter defined now or later by the patent "claims" found in any issued patent herein.

Figure 1:
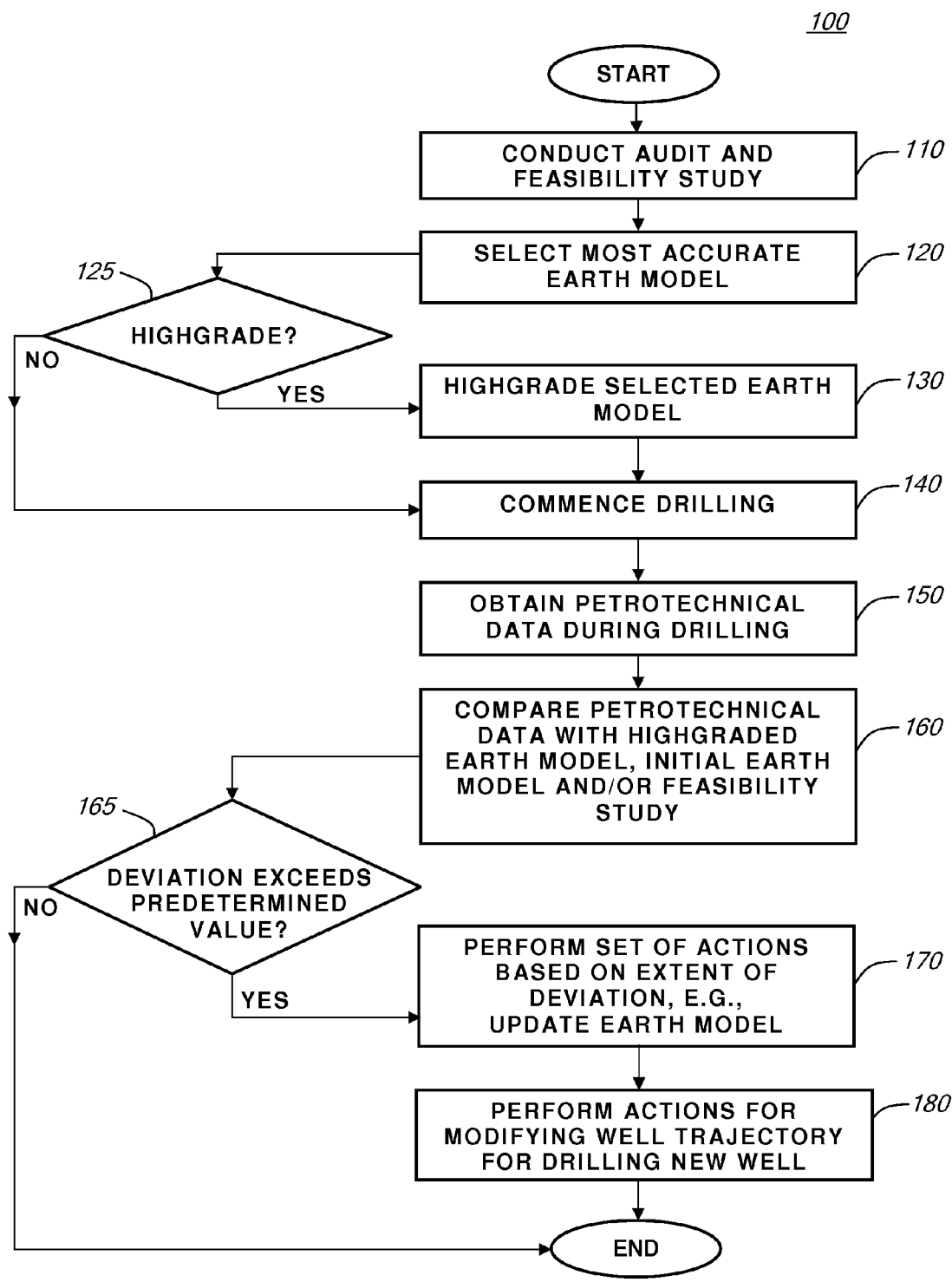
FIG. 1 illustrates a flow diagram of a method for optimizing drilling operations in accordance with implementations of various techniques described herein.

FIG. 1 illustrates a flow diagram of a method 100 for optimizing drilling operations in accordance with implementations of various techniques described herein. At step 110, an audit of available information regarding an earth volume having the planned well to be drilled and feasibility study of drilling the planned well may be conducted. Although implementations of various techniques are described with reference to a well, it should be understood that some implementations may be applied to a system of well bores, sidetracks, multi-laterals and the like. During this step, the quality and relevance of the available information may be assessed. The result of the audit and feasibility study may be used to minimize uncertainties and mitigate risks associated with drilling the planned well.

Available information regarding the planned well may include reports or documentations pertaining to the subsurface structure and properties at or around the planned well. They may also include reports or documentations pertaining to offset wells. Such reports may include well logs, drilling reports, incident analysis, completion practices of offset wells, production history of offset wells and existing surface seismic data.

Figure 2:
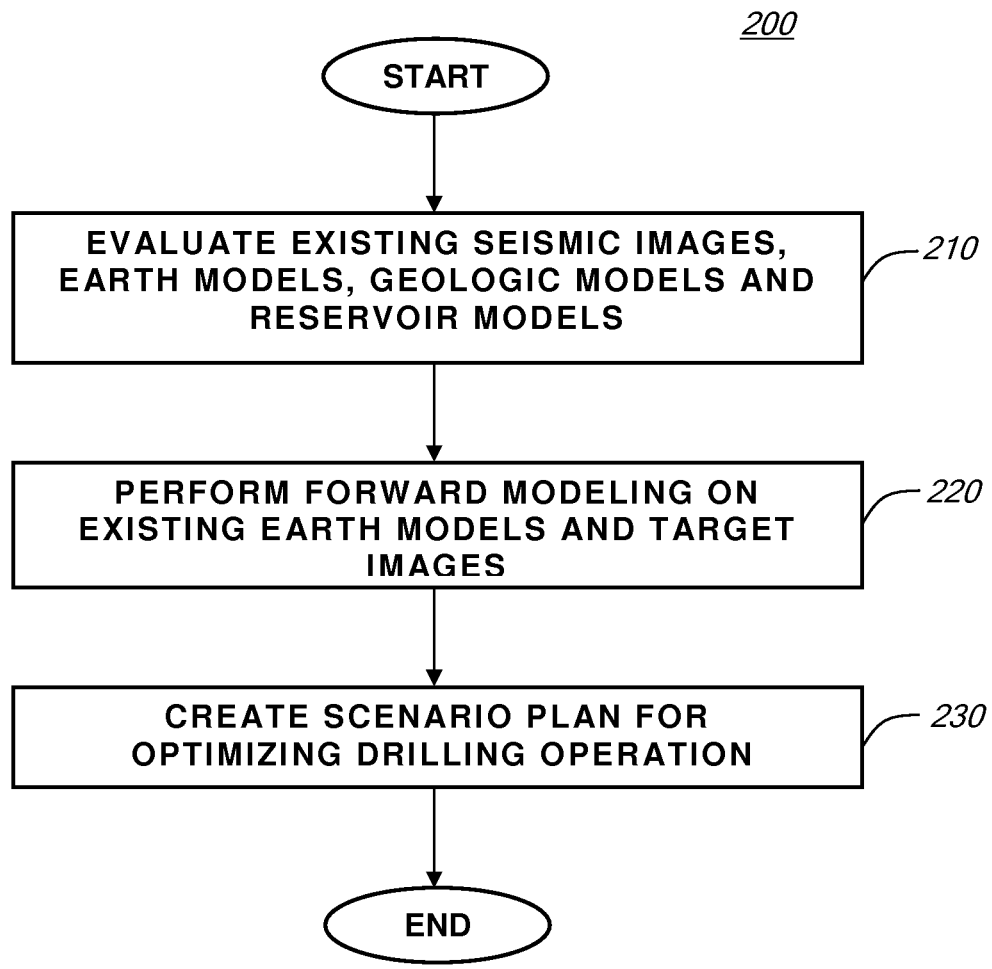
FIG. 2 illustrates a flow diagram of a method for conducting the audit and feasibility study in accordance with various implementations described herein.

FIG. 2 illustrates a flow diagram of a method 200 for conducting the audit and feasibility study in accordance with various implementations described herein. In one implementation, the quality of existing seismic images, earth models, such as, geologic models, reservoir models and depth velocity models of the planned well and of offset wells and other petrotechnical data may be evaluated (step 210). As used herein, petrotechnical data may refer to any reports or documentations obtained, wellbore measurements (e.g., sidetrack, multi-lateral or any well within the earth volume containing the planned well), gravity acquisition data, borehole acquired data (e.g., walkaway or 3D VSP), electromagnetic survey data or the assembled or updated earth model, images derived from the assembled or updated earth model in stacked or pre-stack domain, inversions or properties derived from the assembled or updated earth model, interpretations derived from the assembled or updated earth model, or any combinations thereof. Earth models may contain data that characterize the properties of geological features that form the earth's sub-surface, such as rock formations and faults. The data in an earth model may consist of measurements gathered during activities, such as the seismic, logging or drilling operations of the oil and gas industry, and of interpretations made from these measurements. The data may be gathered above, on, or below the earth's surface.

In one implementation, the earth models to be evaluated are subsurface velocity models in the depth domain. In another implementation, the seismic images to be evaluated are prestack depth images. In yet another implementation, the earth models to be evaluated may be earth model property volumes. When evaluating earth models at the planned well or surrounding areas, vertical and spatial resolution of the earth models, structural constraints from surface geology and borehole measurements, borehole geologic imaging and the nature of model updates and calibration of the earth models by well logs and other available information may be evaluated.

At step 220, forward modeling may be performed on existing earth models of the earth volume, e.g., at the planned well and/or surrounding areas and seismic images of the planned well and/or surrounding areas (step 220). The forward modeling may be performed using ray tracing techniques or other seismic simulation techniques. In one implementation, this step may be performed to facilitate understanding whether the acquisition geometry illuminates the volume in which the planned well is located.

At step 230, a scenario plan for the drilling operation of the planned well may be created. The scenario plan may include evaluating and ranking risks associated with drilling the planned well and proposing appropriate contingency actions similar to an emergency response plan. In one implementation, the scenario plan may include recommendations for additional enhancements and/or interpretation of the subsurface earth model, such as prestack depth migration (PSDM) prior to drilling the well may be made. In another implementation, the scenario plan may include creating a fit-for-purpose catalog of migration algorithms for the construction of the well. The fit-for-purpose catalog of migration algorithms may include information on the quality and turn-around time (TAT) implication on the drilling operation. In yet another implementation, the scenario plan may include establishing a pre-defined plan of earth model perturbations, which may facilitate understanding and quantifying possible impacts on the planned well trajectory as a result of changing seismic image volumes. A catalog of image volumes as a function of velocity field variations may be created. Such a catalog may be used as a look up utility while drilling, since it may include possible impacts in subsurface structural changes as a result of unexpected seismic velocity variations. In still another implementation, the scenario plan may include revising the current well trajectory, preparing a drilling optimization contingency plan to reduce risk and minimize non productive time (NPT), workflows for inversion of reservoir properties for flowing wells, kicks, and the like. In still yet another implementation, the scenario plan may include integrating and visualizing well trajectory, predictive reservoir model, and resolved, calibrated depth imaged volumes to optimize well construction planning. In still another implementation, the scenario plan may include using the seismic amplitude information to invert for material properties that can be vital not only to optimize ongoing drilling operations but also to assess reservoir sections yet to be drilled with respect to predicted hydrocarbon production and recovery.

Referring back to FIG. 1, at step 120, one earth model for the planned well and the surrounding areas based on the feasibility study may be selected. In one implementation, the earth model whose petrotechnical data are substantially similar or consistent is selected. In another implementation, the earth model whose gravity, borehole seismic, surface seismic and magnetotelluric data provide substantially the same depth, volume and shape of the planned well is selected as the most accurate earth model.

At step 125, a determination may be made as to whether the selected earth model may be highgraded. This determination may be made based on the scenario plan created at step 230. If the answer is in the affirmative, then processing continues to step 130. Otherwise, processing skips step 130 and continues to step 140.

At step 130, the selected earth model may be highgraded. During this highgrading step, the resolution and/or calibration of the selected earth model may be enhanced. In one implementation, the resolution of the selected earth model may be enhanced, e.g., through multiple iterations of full 3D tomographic inversion. In another implementation, the resolution of the selected earth model may be enhanced by increasing the vertical and spatial sampling rate. The enhancement in resolution may improve the vertical, spatial and tomographic scale length resolution to levels required for various techniques to optimize drilling operations described herein. In another implementation, the selected earth model may be highgraded by calibrating the earth model to true depth, which may include obtaining wellbore measurements from nearby wells. In yet another implementation, the resolution and calibration of the selected earth model may be optimized in an iterative workflow using borehole-enhanced seismic processing techniques, measurements from offset wells and measurements from other sources, such as magnetotelluric, gravity and the like. In yet another implementation, the anisotropy components of the earth model may be calibrated. During this highgrading step, new earth models and images may be produced.

As a result of highgrading the selected earth model, a portion of the scenario plan may be modified. For instance, the integration and visualization of well trajectory, and predictive reservoir model may be modified using highgraded depth imaged volumes.

At step 140, drilling of the planned well may commence based on the scenario plan created at step 110. At step 150, petrotechnical data regarding the earth volume may be obtained during drilling.

At step 160, the petrotechnical data obtained at step 150 may be compared with the highgraded earth model. In one implementation, the petrotechnical data may be compared with the results of the feasibility study conducted at step 110. For example, the depth of the surface seismic data available from step 110 may be compared with the depth information obtained during drilling. The check-shot data may be compared with velocity data available from step 110. The lithology report may be compared with the lithology from the selected earth model. In another implementation, the petrotechnical data may be compared with the initial earth model selected at step 120. The petrotechnical data may be processed prior to being compared. For instance, the petrotechnical data may be processed to remove noise from the data. In one implementation, the comparison may be made on real time. In another implementation, the comparison may be made within a time period sufficient to modify or confirm the drilling plan.

At step 165, a determination may be made as to whether the deviation between the petrotechnical data obtained at step 150 and the initial selected earth model, the highgraded earth model or the results of the feasibility study exceeds a predetermined value. If the deviation is less than the predetermined value, then processing ends and the planned well is drilled according to the existing drilling plan. On the other hand, if the deviation exceeds the predetermined value, then processing continues to step 170.

At 170, one or more set of actions may be performed based on the extent to which the petrotechnical data obtained at step 150 deviate from the highgraded earth model, the initial earth model or the results of the feasibility study. The set of actions may include techniques of various levels of technical sophistication for depth imaging, which may range from vertical stretching, map migration, post-stack depth migration to pre-stack depth migration. The magnitude of the deviation may be used to determine the action to be performed. The set of actions may be part of the scenario plan developed at step 230.

In one implementation, the selected earth model may be updated, i.e., by relaunching the migration imaging process, when the wellbore measurements vary from the results of the feasibility study by a predetermined value, e.g., when the depth varies by more than 5%. The migration imaging process may range from creating a 3D anisotropic depth model, merging the 3D anisotropic depth model in depth sections, performing a prestack depth migration to performing tomographic anisotropic properties update. In another implementation, the level of technical sophistication and cost associated with the migration imaging process may be provided. In addition or in lieu of wellbore measurements, the selected earth model may be updated using other types of measurements during drilling, e.g., gravity survey measurements, electromagnetic survey measurements and the like. In one implementation, the selected earth model may be updated at predetermined times in the drilling plan.

Figure 6:
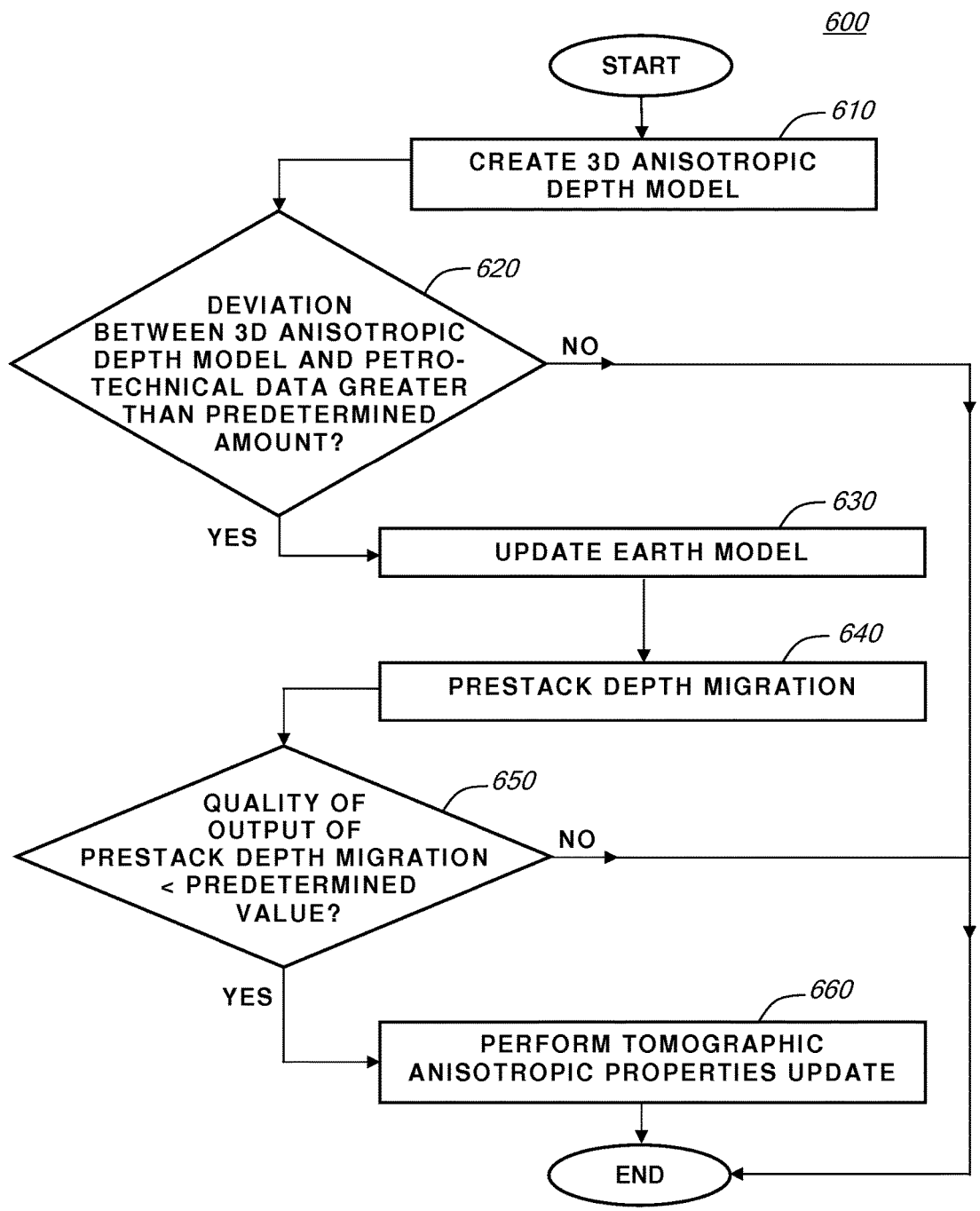
FIG. 6 illustrates a flow diagram of a method for performing a migration imaging process in accordance with implementations of various techniques described herein.

FIG. 6 illustrates a flow diagram of a method 600 for performing a migration imaging process in accordance with implementations of various techniques described herein. The migration imaging process may be an iterative process. At step 610, the earth model may be updated by creating a 3D anisotropic depth model. At step 620, a comparison may then be made between the 3D anisotropic depth model and the petrotechnical data obtained at step 150, and a determination may be made as to whether the deviation exceeds a predetermined value. If the answer is in the affirmative, then the earth model may be updated using the petrotechnical data obtained during drilling (step 630). In one implementation, this updating step may include merging the 3D anisotropic depth model in depth sections. The updated earth model may then be used to perform a prestack depth migration (step 640). A determination may then be made as to whether the quality of the output of the prestack depth migration falls below a predetermined value (step 650). In one implementation, the "flatness" of the prestack depth gathers may be evaluated, i.e., a determination may be made as to whether the prestack depth gathers are substantially flat. In another implementation, the prestack depth stack may be compared against the petrotechnical data obtained during drilling (at step 150). The "focus" of the prestack depth stack may be interpreted prior to comparison. In yet another implementation, the errors of the residual moveout cube may be evaluated. If the quality of the output falls below the predetermined value, then the earth model may be further updated by performing a tomographic anisotropic properties update (step 660).

Referring back to FIG. 1, at step 180, a set of actions for modifying the well trajectory for drilling the planned well may be performed based on the updated earth model and information gained from the audit and feasibility study. In one implementation, steps 150 through 180 may continue as long as drilling is in progress.

Figure 3:
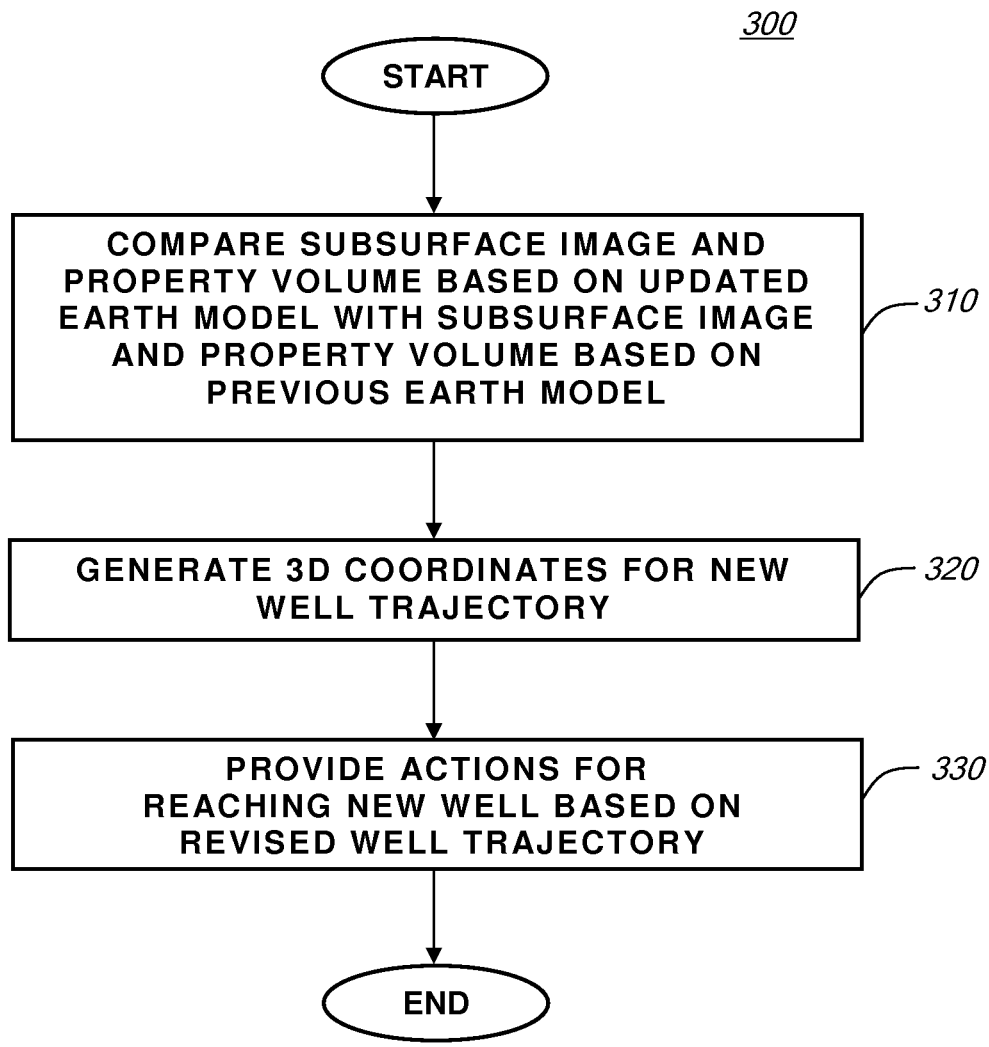
FIG. 3 illustrates a process for generating the set of actions for modifying the drilling plan in accordance with implementations described herein.

FIG. 3 illustrates an example of the process 300 for performing the set of actions to modify the drilling plan in more detail. At step 310, a comparison may be made between the subsurface image and property volume based on the updated earth model and the subsurface image and property volume based on the earth model prior to the update, e.g., the highgraded earth model. Variation between the subsurface image and property volume based on the updated earth model and the subsurface image and property volume based on the earth model prior to the update may be highlighted, characterized and interpreted in the context of the existing and future well location. The interpretation may be enhanced to include production related considerations, such as maximum reservoir contact, ultimate recovery, reservoir pressure, permeability and the like.

At step 320, a set of 3D coordinates (X,Y,Z) for a revised well trajectory may be generated based on the subsurface image and property volume of the updated earth model, the subsurface image and property volume of the earth model prior to the update and geosteering. In one implementation, the set of 3D coordinates (X, Y, Z) for the revised well trajectory may represent an optimal well trajectory for optimized production and recovery.

At step 330, a set of actions for reaching the new well based on the revised well trajectory may be performed. In one implementation, the set of actions may include providing a design of the revised well trajectory. The design may take into account various issues, such as effects on changing the drilling procedures, parameters and materials, a cost benefit and drilling risk analysis. Further, economic and technical analysis may be performed to determine if the new well trajectory is adopted. Such economic analysis may include calculations of net present value, cost of drilling change, estimated ultimate recovery, safety and environmental implications.

In one implementation, the set of actions for reaching the new well may include changing the casing plan, mud weights and the like. In another implementation, the set of actions for reaching the new well may include defining a new drilling plan and well construction, changing drilling, casing, coring, completion operations and production plans. In yet another implementation, the set of actions for reaching the new well may include recommendations for reducing drilling risk, e.g., by confirming, changing or modifying the drilling fluid, and/or deriving elastic properties from the updated earth model.

Figure 4:
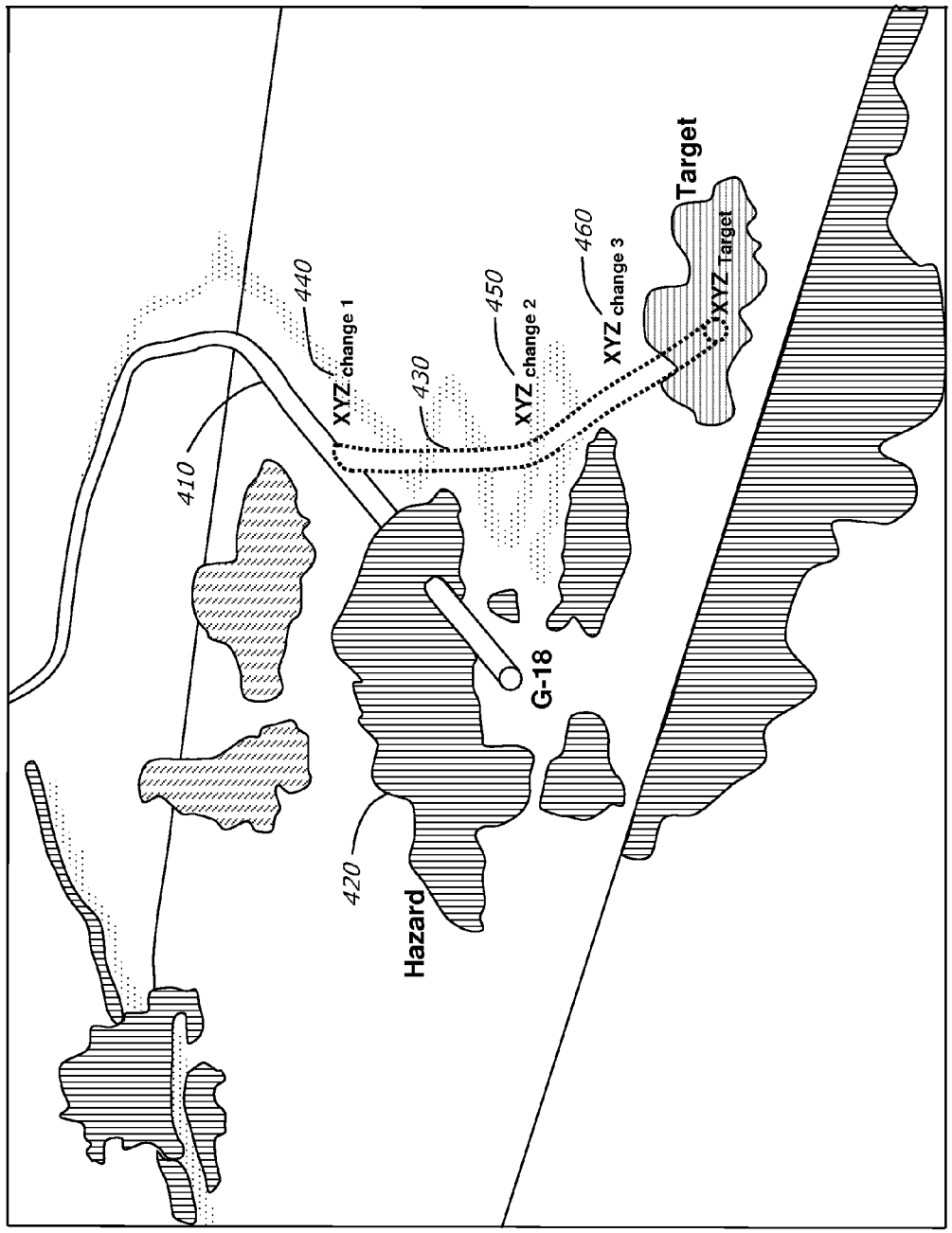
FIG. 4 illustrates an example of a well trajectory that has been modified in accordance with various implementations described herein.

FIG. 4 illustrates an example of a well trajectory that has been modified in accordance with various implementations described herein. In particular, the initial well trajectory 410 is shown to traverse through hazard 420. A new well trajectory 430 is provided based on 3D coordinates 440, 450 and 460.

In this manner, various techniques described herein allow the modification of well trajectory and/or improve operational parameters while the well is being drilled. Benefits to the operators may include increased operational efficiency and safety, reduced cost, risk mitigation and improved reservoir production performance and hydrocarbon recovery.

In one implementation, the set of actions for reaching the new well may include full aperture, prestack, three dimensional depth imaging in real time (which may be referred to as SGD imaging) using the petrotechnical data acquired during drilling to improve the accuracy of the earth model with which the seismic data are depth imaged. The SGD imaging may produce more structurally accurate images and common image gathers, which may be imaged hundreds to thousands of feet ahead of and around the drill bit, thereby providing a look ahead and around the drill bit. The resulting images, the common image gathers and the resulting earth model, the petrotechnical data acquired while drilling, petrotechnical data gathered prior to drilling, and/or inversions of any combination of the above mentioned petrotechnical data may be used to confirm or modify the drilling plan during the drilling operation.

Common image gathers output from the SGD imaging in various domains, such as offset or angle, may be used to alter the earth model. The altered earth model may be used for additional iterations of SGD imaging or for possible inversions for fluid, porosity or pore pressure. Moveout estimates derived from the common image gathers provide input to tomography inversions to solve for depth velocity variations, and/or provide a measure of the quality of the image and/or input to anisotropy estimations. Depth velocity constitutes one of the properties of the earth model. Alterations to the depth velocity property and anisotropy parameters may be performed based on the petrotechnical data, such as check shot, mud log, sonic, seismicVision and VSP data acquired while drilling and/or gathered from prior drilling operations.

As mentioned above, various techniques described herein for optimizing drilling operations may include full aperture, three dimensional, prestack tomography inversion in real time to solve for depth velocity variations, which may include anisotropy parameters at, around and ahead of the drill bit during drilling operations. The tomography inversion and/or earth model may be constrained or altered by combining petrotechnical data acquired while drilling and/or gathered from prior drilling operations prior to and/or during the current drilling operation. Various techniques described herein may also make use of a-priori anisotropy estimates derived from any petrotechnical data source, such as prior drilling operations, walk-away vertical seismic profile (VSP) data and/or lithology knowledge. A-priori anisotropy estimates may be used to constrain or alter tomography inversions for depth velocity properties and/or directly alter the current version of the earth model.

Various techniques described herein may also make use of interpretations of events exhibited in the seismic image. The interpretation of exhibited seismic image events alone and/or in combination with petrotechnical data acquired while drilling and/or petrotechnical data gathered from prior drilling operations may constrain and/or validate the current earth model and/or results from tomography inversions to produce a new earth model.

The common image gather flatness output from an iteration of SGD imaging may be used to confirm the quality of the image for structural positioning and the quality of the earth model used for SGD imaging. One measure of the quality of the image and the earth model is the degree to which they tie the depths measured in the current drilling operation and/or any other prior drilling operations (i.e., which may be referred to as offset wells) from which we may have gathered petrotechnical data. The convergence of results between petrotechnical data acquired during drilling, and/or gathered prior to drilling and/or produced with various techniques described herein, prior to and/or during drilling operations, may be another validation to increase the confidence of advice given regarding changes to the drilling plan.

The validated earth model and gathers may be used directly for pore pressure inversion. The resulting pore pressure volume constitutes another property of the earth model. The pore pressure property of the earth model may be used to provide the pressure curves along any selected drilling trajectory to better understand the mud weights required during drilling operations. This feature may be of particular benefit to drilling operations that are at risk of encountering unexpected pressures that deviate from the drilling plan, e.g., when accurate position of the base of salt is unknown prior to drilling operations. The updated images, common image gathers, earth models including any property extracted from the earth model and/or interpretations generated with various techniques described herein may enable a better prediction of the location of base of salt in advance of the drilling operation reaching the base of salt.

Various products generated during drilling, data acquired during drilling, and data gathered prior to drilling may constitute a sub-set of petrotechnical data, which may be integrated to the advantage of the drilling operation.

Various techniques described herein may include multiple iterations of:
a) full aperture, prestack, three dimensional depth imaging in real time during the drilling operation, which may be referred to as SGD imaging;
b) updates to the earth model using any available petrotechnical data;
c) full aperture, three dimensional, prestack tomography inversion in real time to solve for the variations in the depth velocity property of the earth model, which may include anisotropy parameters at, around and ahead, of the drill bit during the drilling operation;
d) interpretation of initial and resulting images and any other petrotechnical data, which may result in advising changes to the drilling plan, including the drilling trajectory;
e) inversions of products generated during drilling operations to solve for properties, such as depth velocity and pore pressure;
f) the use of petrotechnical data available in comparative modes to increase the confidence of any of the individual data;
g) generating advice to confirm the parameters of the current drilling plan or to change the parameters of the current drilling plan based on evidence produced from petrotechnical data obtained during drilling alone or in combination with petrotechnical data gathered prior to drilling. the change in drilling plan may include changing the drilling trajectory, mud weights, bit gauge etc.

Figure 5:
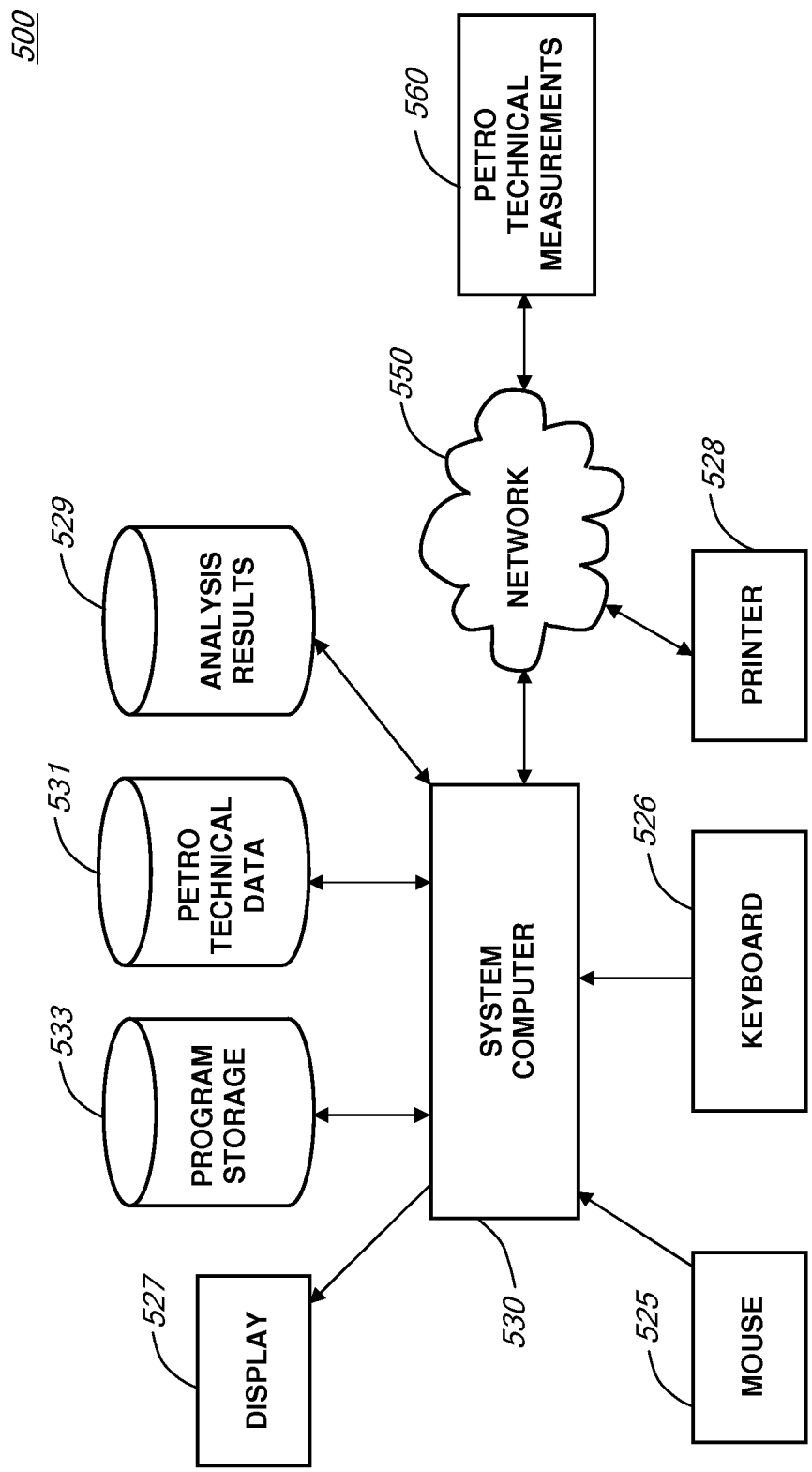
FIG. 5 illustrates a computing system, into which implementations of various techniques described herein may be implemented.

FIG. 5 illustrates a computing system 500, into which implementations of various technologies described herein may be implemented. The computing system 500 may include one or more system computers 530, which may be implemented as any conventional personal computer or server. In one implementation, the system computers 530 may include an engineering workstation, which may be configured to support interactive tasks, such as job set-up, job monitoring and quality control, parameter selection, data visualization and the like. In another implementation, the system computers 530 may include a batch computer system, which may be configured to run batch data conditioning jobs, run batch imaging jobs and the like. In yet another implementation, the system computers 530 may include a utility server, which may be configured to perform database services, resource control management, job submission, directory services, systems installation and maintenance, security services and the like. However, those skilled in the art will appreciate that implementations of various technologies described herein may be practiced in other computer system configurations, including hypertext transfer protocol (HTTP) servers, hand-held devices, multiprocessor systems, microprocessor-based or programmable consumer electronics, network PCs, computer clusters, minicomputers, mainframe computers, and the like.

The system computer 530 may be in communication with disk storage devices 529, 531, and 533, which may be external hard disk storage devices. It is contemplated that disk storage devices 529, 531, and 533 are conventional hard disk drives, and as such, will be implemented by way of a local area network or by remote access. Of course, while disk storage devices 529, 531, and 533 are illustrated as separate devices, a single disk storage device may be used to store any and all of the program instructions, measurement data, and results as desired.

In one implementation, various measurements, e.g., petrotechnical data, may be stored in disk storage device 531. The system computer 530 may retrieve the appropriate data from the disk storage device 531 to process the various measurements according to program instructions that correspond to implementations of various technologies described herein. The program instructions may be written in a computer programming language, such as C++, Java and the like. The program instructions may be stored in a computer-readable medium, such as program disk storage device 533. Such computer-readable media may include computer storage media and communication media. Computer storage media may include volatile and non-volatile, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the system computer 530. Communication media may embody computer readable instructions, data structures, program modules or other data in a modulated data signal, such as a carrier wave or other transport mechanism and may include any information delivery media. The term "modulated data signal" may mean a signal that has one or more of its characteristics set or changed in such a manner as to encode information in the signal. By way of example, and not limitation, communication media may include wired media such as a wired network or direct-wired connection, and wireless media such as acoustic, RF, infrared and other wireless media. Combinations of any of the above may also be included within the scope of computer readable media.

In one implementation, the system computer 530 may present output primarily onto graphics display 527, or alternatively via printer 528. The system computer 530 may store the results of the methods described above on disk storage 529, for later use and further analysis. The keyboard 526 and the pointing device (e.g., a mouse, trackball, or the like) 525 may be provided with the system computer 530 to enable interactive operation.

The system computer 530 may be located at a data center remote from the drilling operation. The system computer 530 may be in communication with the various measuring tools to receive various signals indicative of the planned well. These signals, after conventional formatting and other initial processing, may be stored by the system computer 530 as digital data in the disk storage 531 for subsequent retrieval and processing in the manner described above. While FIG. 5 illustrates the disk storage 531 as directly connected to the system computer 530, it is also contemplated that the disk storage device 531 may be accessible through a local area network or by remote access. Furthermore, while disk storage devices 529, 531 are illustrated as separate devices for storing petrotechnical data and analysis results, the disk storage devices 529, 531 may be implemented within a single disk drive (either together with or separately from program disk storage device 533), or in any other conventional manner as will be fully understood by one of skill in the art having reference to this specification.

The computing system 500 may further be in communication with data storage 560, which is configured to store petrotechnical measurements. Data storage 560 may be located on a rig on site or away from the system computer 530. For instance, data storage 560 may be on a drilling platform or a land rig. Communication between the system computer 530 and the data storage 560 may be facilitated by a communication network 550. The communication network 550 may include a wide area network (WAN), a satellite link, local area network (LAN), or other suitable network or combinations thereof.

Although the data storage 560 is shown to be connected to the system computer 530 via the communication network 550, it should be understood that each component may be connected to another component in any way convenient. For instance, the display 527 may be connected to disk storage device 529 through the system computer 530. Likewise, the program storage 533 may be directly connected to the system computer 530. Further, the system computer 530 may have many computing nodes that are distributed in various locations.

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for optimizing drilling operations, comprising:
   providing an earth model of a volume having a well;
   creating a scenario plan for a drilling operation of the well;
   obtaining petrotechnical data about the volume during the drilling operation;
   comparing the petrotechnical data with the earth model, the scenario plan, or combinations thereof;
   updating the earth model with the petrotechnical data based on the comparison with the earth model, the scenario plan, or combinations thereof, wherein the earth model is updated using a migration imaging process that comprises:
      creating a 3D anisotropic depth model;
      comparing the 3D anisotropic depth model to the petrotechnical data;
      updating the earth model using the petrotechnical data to create a first updated earth model when a deviation between the 3D anisotropic depth model and the petrotechnical data exceeds a first predetermined value;
      performing a prestack depth migration using the first updated earth model; and
      updating the first updated earth model by performing a tomographic anisotropic properties update to create a second updated earth model when a quality of an output of the prestack depth migration falls below a second predetermined value;
   determining at least one action from a set of actions from the scenario plan to be performed based on the second updated earth model;
   performing the at least one action from the scenario plan; and
   modifying a drilling plan of the well using the updated earth model.

2. The method of claim 1, wherein modifying the drilling plan comprises:
   comparing a subsurface image, property volume or interpretation, or combinations thereof, derived from the earth model with a subsurface image, property volume or interpretation, or combinations thereof, derived from the updated earth model; and
   generating a set of three dimensional (3D) or two dimensional (2D) coordinates for a well trajectory based on the comparison.

3. The method of claim 1, wherein modifying the drilling plan comprises:
   providing a design of a well trajectory;
   performing an economic and technical analysis of the well trajectory;
   changing an existing casing plan;
   defining a well construction based on the well trajectory;
   defining a well construction based on interpretations or properties derived from the updated earth model; or combinations thereof.

4. The method of claim 1, further comprising:
   conducting an audit and feasibility study on the volume; and
   selecting the earth model based on the audit and feasibility study.

5. The method of claim 4, wherein conducting the audit and feasibility study on the volume comprises assessing a quality and relevance of available petrotechnical information regarding the volume.

6. The method of claim 5, wherein the available petrotechnical information regarding the volume comprises reports or documentations pertaining to a subsurface structure and properties at or around the volume.

7. The method of claim 5, wherein selecting the earth model based on the audit and feasibility study comprises selecting the earth model that is most congruent with the available petrotechnical information regarding the volume.

8. The method of claim 4, wherein conducting the audit and feasibility study on the volume comprises performing forward modeling on earth models and seismic images of the volume.

9. The method of claim 8, wherein the forward modeling comprises ray tracing, wavefield modeling or finite difference techniques or combinations thereof.

10. The method of claim 1, further comprising highgrading the earth model prior to the drilling operation.

11. The method of claim 10, wherein highgrading the earth model comprises enhancing a resolution of the earth model.

12. The method of claim 11, wherein enhancing the resolution of the earth model comprises increasing a vertical and spatial sampling rate.

13. The method of claim 10, wherein highgrading the earth model comprises enhancing a calibration of the earth model.

14. The method of claim 13, wherein enhancing the calibration of the earth model comprises calibrating the earth model to depth.

15. The method of claim 1, wherein the petrotechnical data comprise wellbore measurements, gravity acquisition data, borehole seismic data, electromagnetic survey data, surface seismic data or combinations thereof.

16. The method of claim 1, further comprising performing the drilling operation according to the drilling plan.

17. The method of claim 1, further comprising using the scenario plan to minimize uncertainties and mitigate risks associated with the drilling operation.

18. The method of claim 1, wherein the scenario plan is created prior to obtaining the petrotechnical data.

19. The method of claim 1, wherein updating the earth model comprises performing a tomography inversion.

20. A method for optimizing drilling operations of a well, comprising:
creating a scenario plan for a drilling operation of the well;
highgrading an earth model of a volume having the well prior to the drilling operation;
obtaining petrotechnical data about the volume during the drilling operation;
creating a three-dimensional (3D) anisotropic depth model based on the highgraded earth model;
updating the highgraded earth model with the petrotechnical data, wherein the highgraded earth model is updated using a migration imaging process that comprises:
comparing the 3D anisotropic depth model to the petrotechnical data;
updating the highgraded earth model using the petrotechnical data to create a first updated highgraded earth model when a deviation between the 3D anisotropic depth model and the petrotechnical data exceeds a first predetermined value;
performing a prestack depth migration using the first highgraded updated earth model; and
updating the first highgraded updated earth model by performing a tomographic anisotropic properties update to create a second updated highgraded earth model when a quality of an output of the prestack depth migration falls below a second predetermined value;
determining at least one action from a set of actions from the scenario plan to be performed based on the second updated highgraded earth model;
performing the at least one action from the scenario plan; and
modifying a drilling plan of the well using the updated highgraded earth model.

21. The method of claim 20, wherein modifying the drilling plan comprises generating a set of three dimensional (3D) coordinates for a well trajectory.

22. The method of claim 20, wherein highgrading the earth model comprises enhancing a resolution of the earth model.

23. The method of claim 22, wherein enhancing the resolution of the earth model comprises increasing a vertical and spatial sampling rate.

24. The method of claim 20, wherein highgrading the earth model comprises enhancing a calibration of the earth model.

25. The method of claim 24, wherein enhancing the calibration of the earth model comprises calibrating the earth model to depth.

26. A method for conducting an audit and feasibility study for drilling operations, comprising:
evaluating a quality and relevance of available petrotechnical information regarding a volume having a well to be drilled;
performing a forward modeling on earth models and seismic images of the volume prior to drilling the well;
generating a scenario plan for the well, wherein generating the scenario plan comprises creating a catalog of image volumes as a function of velocity field variations in the volume;
looking up values in the catalog while drilling, wherein the catalog includes possible impacts in subsurface structural changes as a result of unexpected seismic velocity variations; and
revising the scenario plan in response to the subsurface structural changes.

27. The method of claim 26, wherein the available petrotechnical information regarding the volume comprises reports or documentations pertaining to a subsurface structure and properties at or around the volume.

28. The method of claim 27, wherein the reports or documentations comprise well logs, drilling reports, incident analysis, completion practices of offset wells, production history of offset wells, existing surface seismic data, data created with forward modeling, existing earth models or elements of the earth model, borehole seismic, interpretations, gravity surveys, electromagnetic surveys, reservoir properties, other petrotechnical information or combinations thereof.

29. The method of claim 26, wherein the earth models comprise subsurface velocity models in depth domain or earth model property volumes.

30. The method of claim 26, further comprising using the scenario plan to minimize uncertainties and mitigate risks associated with drilling the well.

31. The method of claim 26, wherein the forward modeling comprises ray tracing techniques, wavefield modeling, finite difference techniques or combinations thereof.

32. The method of claim 26, wherein generating the scenario plan comprises evaluating risks associated with drilling the well and proposing appropriate contingency actions in response to the risks.

33. The method of claim 26, wherein the scenario plan comprises establishing a pre-defined plan of earth model perturbations, revising a current well trajectory of the well, revising workflows for inversion of reservoir properties for flowing wells, recommending enhancements of an earth model of the well, interpreting the earth model, or combinations thereof.

34. The method of claim 26, wherein the seismic images comprise prestack depth images.

35. A computer system, comprising:
a processor; and
a memory comprising program instructions executable by the processor to:
  create a scenario plan for a drilling operation of a well;
  highgrade an earth model of a volume having the well prior to the drilling operation;
  obtain petrotechnical data about the volume during the drilling operation;
  compare the petrotechnical data with the highgraded earth model;
  updating the highgraded earth model with the petrotechnical data based on the comparison, wherein the highgraded earth model is updated using a migration imaging process that comprises:
    creating a 3D anisotropic depth model;
    comparing the 3D anisotropic depth model to the petrotechnical data;
    updating the highgraded earth model using the petrotechnical data to create a first updated highgraded earth model when a deviation between the 3D anisotropic depth model and the petrotechnical data exceeds a first predetermined value;
    performing a prestack depth migration using the first highgraded updated earth model; and
    updating the first highgraded updated earth model by performing a tomographic anisotropic properties update to create a second updated highgraded earth model when a quality of an output of the prestack depth migration falls below a second predetermined value;
  determining at least one action from a set of actions from the scenario plan to be performed based on the second updated highgraded earth model;
  performing the at least one action from the scenario plan;
  perform an inversion for pore pressure or lithology properties of the updated highgraded earth model; and
  modify a drilling plan of the well using the updated highgraded earth model.

36. The computer system of claim 35, wherein the memory comprising program instructions executable by the processor to highgrade the earth model comprises program instructions executable by the processor to enhance a resolution of the earth model.

37. The computer system of claim 35, wherein the memory comprising program instructions executable by the processor to highgrade the earth model comprises program instructions executable by the processor to enhance a calibration of the earth model.

38. A computer system, comprising:
a processor; and
a memory comprising program instructions executable by the processor to:
  evaluate a quality and relevance of available petrotechnical information regarding a volume having a well to be drilled;
  perform a forward modeling on earth models and seismic images of the volume prior to drilling the well;
  generate a scenario plan for the well, wherein generating the scenario plan comprises creating a catalog of image volumes as a function of velocity field variations in the volume;
  looking up values in the catalog while drilling, wherein the catalog includes possible impacts in subsurface structural changes as a result of unexpected seismic velocity variations; and
  revising the scenario plan in response to the subsurface structural changes.

39. The computer system of claim 38, wherein the available petrotechnical information regarding the volume comprises reports or documentations pertaining to a subsurface structure and properties at or around the volume.

* * * * *